United States Patent
Tarantino

[11] Patent Number: 5,951,810
[45] Date of Patent: *Sep. 14, 1999

[54] METHOD FOR MOUNTING AN ELECTRONIC MODULE IN A CARD BODY

[75] Inventor: Thomas Tarantino, München, Germany

[73] Assignee: Giesecke & Devrient GmbH, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/590,486

[22] Filed: Jan. 24, 1996

[30] Foreign Application Priority Data

Jan. 26, 1995 [DE] Germany ............... 195 02 398

[51] Int. Cl.$^6$ .................................................. B29C 65/18
[52] U.S. Cl. ...................... 156/293; 156/282; 156/311; 156/312
[58] Field of Search .................... 156/282, 293, 156/311, 312, 322, 324.4, 309.9; 29/831; 361/737; 235/488, 492

[56] References Cited

U.S. PATENT DOCUMENTS

| | | | |
|---|---|---|---|
| 3,166,462 | 1/1965 | Schoder | 156/311 |
| 3,600,248 | 8/1971 | Mojonnier et al. | 156/311 |
| 3,692,608 | 9/1972 | Risgaard | 156/282 |
| 3,951,713 | 4/1976 | Emmel | 156/309.9 |
| 4,450,024 | 5/1984 | Haghiri-Tehrani et al. | 156/306.6 |
| 4,543,147 | 9/1985 | Noto et al. | 156/312 |
| 4,625,102 | 11/1986 | Rebjock et al. | 235/488 |
| 4,737,620 | 4/1988 | Mollet et al. | |
| 4,897,534 | 1/1990 | Haghiri-Tehrani | 235/488 |
| 5,057,679 | 10/1991 | Audic et al. | 235/488 |
| 5,145,548 | 9/1992 | Yamamoto | 156/583.5 |
| 5,346,576 | 9/1994 | Kobayashi et al. | 156/293 |

FOREIGN PATENT DOCUMENTS

| | | | |
|---|---|---|---|
| 0 493 738 | 8/1992 | European Pat. Off. | |
| 2701139 | 8/1994 | France | |
| 2703806 | 10/1994 | France | 235/492 |
| 1-033749 | 2/1989 | Japan | |

OTHER PUBLICATIONS

Shields, *Adhesives Handbook*, pp. 258–260, 1970.
Landrock, *Adhesives Technology Handbook*, pp. 211–213, 1985.
Abstract for Europe 493738.

*Primary Examiner*—Steven D. Maki
*Attorney, Agent, or Firm*—Bacon & Thomas, PLLC

[57] ABSTRACT

A method is described for mounting an electronic module in an opening in a card body using pressure and heat. To avoid the thermal load on the electronic module and the card body during the relatively short heating-up phase in a fixed-cycle production process, the method is divided into several method steps, whereby either the heating of the electronic module and the card body and optionally a thermally-activable adhesive takes place in several method steps, or a thermally activable adhesive is heated selectively in a first method step and the mounting of the electronic module takes place under pressure or under pressure and heat in a second method step.

7 Claims, 2 Drawing Sheets

METHOD FOR MOUNTING AN ELECTRONIC MODULE IN A CARD BODY

FIELD OF INVENTION

This invention relates to a method for mounting an electronic module in an opening in a card body using heat and pressure. The invention relates further to an apparatus for carrying out the method and to a data carrier produced by the method.

BACKGROUND OF THE INVENTION

Methods of the abovementioned type are well known to the expert. They are used for producing electronic data carriers, for example IC cards. The electronic module connected with the card body in an opening of the card body includes at least an integrated circuit and coupling elements connected electrically with the integrated circuit. The thus constructed data carrier can communicate with a specially provided external device via the coupling elements. Such data carriers have been known for some time and are already used today for example as identity cards, credit cards or check cards.

For example EP 493 738 A1 describes a data carrier produced by the abovementioned method. The data carrier consists of a card body and an electronic module glued to the card body in a two-step opening therein. The electronic module has a carrier film with contact surfaces applied thereto for contacting communication of the electronic module. An integrated circuit is fastened to the side of the carrier film facing away from the contact surfaces, and connected electrically with the contact surfaces. The integrated circuit and connecting lines are surrounded by a casting compound. A film of thermally activable adhesive is furthermore applied to the side opposite the contact surfaces. The electronic module is glued in the two-step opening in the card body by being pressed into the opening in the card body by means of a heated die. Due to the heat the thermally activable adhesive melts, thereby gluing the electronic module to the card body. During the process the back of the card lies on a cooling die.

U.S. Pat. No. 4,737,620 shows a method for producing a data carrier and a data carrier thus produced. The data carrier consists of a card body in the opening of which an electronic module is installed. The electronic module has a carrier substrate on which contact surfaces for contacting communication are located. An integrated circuit is fastened to the substrate and connected electrically with the contact surfaces. The substrate further has windows for connecting the module with the card body. For this purpose the module is pressed into the opening in the card body by means of a heatable die, causing the card material to soften in the area of the electronic module that is pressed into the specially provided windows of the carrier substrate, whereby connecting the module with the card body The stated methods for mounting modules in cards are as a rule integrated into a production process in which other method steps are performed both prior to and after the mounting process.

All processes are subject to a fixed cycle time which should be selected as small as possible to optimize throughput. Due to the resulting short cycle time a relatively high temperature must be selected for mounting the module to soften the thermally activable adhesive or card material sufficiently. This results in relatively high thermal loads for the electronic module and for the card material. For example the terminals of the conductive connections are greatly heated particularly on the contact surfaces, which can lead to a weakening of the connections. Furthermore the great heating also causes stresses in the card body material, so that the side of the card body facing away from the electronic module has deformations particularly in the area of the thin bottom of the opening. For the stated reasons the cycle time can therefore not be shortened at will.

OBJECTS OF THE INVENTION

The present invention is therefore based on the problem of proposing a method for mounting the electronic module in the card body which reduces the thermal load on the electronic module and the card body while increasing the throughput.

SUMMARY OF THE INVENTION

The basic idea of the invention is to be seen in dividing the method for mounting the electronic module in the data carrier into several steps. Either the heating of the electronic module, the card body and optionally the thermally activable adhesive is spread over several working steps, or the thermally activable adhesive is heated selectively in at least a first step and the electronic module mounted under pressure or under pressure and heat in a following step.

The advantages of the invention are to be seen particularly in that it reduces the thermal load on both the module and the card. This results in a higher duration of use for the data carrier. Furthermore the card body has fewer deformations, which increases the optical quality of the data carrier. A further advantage is that the throughput of produced cards can be increased, which leads to a reduction of production costs.

The inventive method provides for performing the mounting of the electronic module in a two-step opening in the card body in at least two successive steps.

This can be done according to a first embodiment by preheating the electronic module, the card body and optionally the thermally activable adhesive at least in a first step and performing the mounting under pressure and heat only in a further step. Alternatively the electronic module and the card body an already be subjected to pressure during heating in the first working step. The temperature to which the electronic module is subjected should preferably be kept as low as possible in the first working step and thus be lower than that of the last working step in order to minimize the thermal load on the electronic module and the card body owing to the strong temperature differences. The electronic module and the card body can be cooled after mounting in an additional working step.

According to a second embodiment the thermally activable adhesive is heated selectively in at least a preliminary step and the electronic module mounted under pressure or under pressure and heat in a further step. The selective heating or the thermally activable adhesive is done by supplying energy from the welding unit, the supplied energy being absorbed predominantly by the thermally activable adhesive.

An inventive data carrier has a card body and a module located in a two-step opening in the card body. The electronic module includes at least a carrier substrate, for example in the form of a carrier film, with coupling elements such as contact surfaces, on which an integrated circuit is fixed and connected electrically with the coupling elements. The carrier substrate is fixed on the card body either by a thermally activable adhesive or by the card material itself. In the latter case the carrier substrate has windows into which the softened card material can penetrate when the electronic module is pressed together with the card body. Alternatively the integrated circuit and conductive connections can be surrounded with a casting compound in the way known in the art.

A welding unit for performing the inventive method has at least a heatable die and a corresponding base between which the electronic module is mounted in the opening in the card body under pressure and heat. The additional base can be executed for example in the form of a cooling die. In addition a device for preheating the electronic module and the card body is provided. This may be for example a further heatable die with a corresponding base, or a heating device which at least partly surrounds the card body and electronic module. In addition a cooling device can be provided for cooling the electronic module as well as the card body after mounting. Such a cooling device can consist for example of a further die with a corresponding base, both components being preferably cooled. The welding unit furthermore has a transport device for transporting the card body with the module located in the opening to the welding unit devices in the system cycle. This may be for example a transport band.

BRIEF DESCRIPTION OF THE DRAWINGS

Further advantages and features of the invention will result from the figures, in which.

DETAILED DESCRIPTION OF THE PREFERRED EMBODIMENTS OF THE INVENTION

Figure 1:
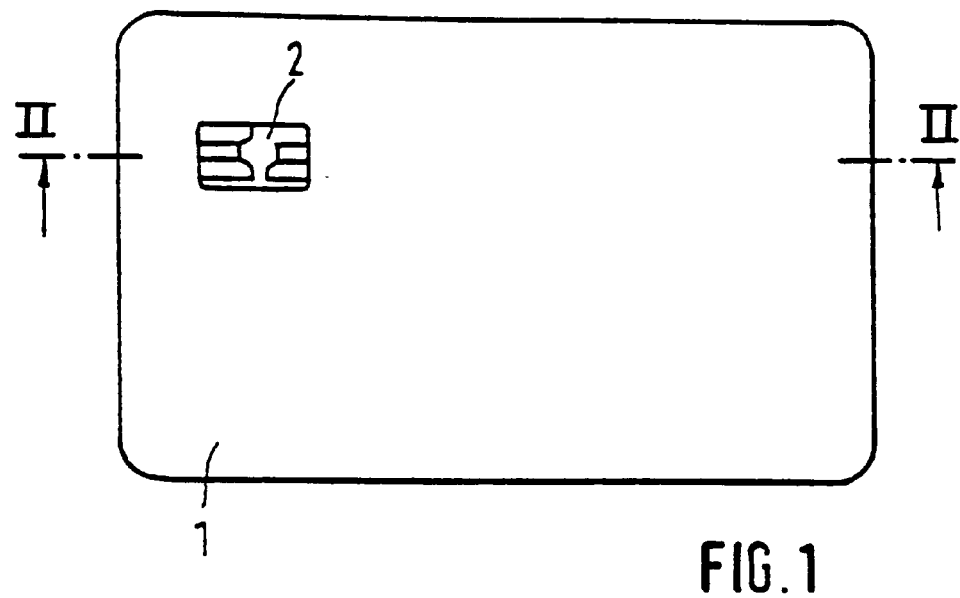
FIG. 1 shows a data carrier with an installed module.

FIG. 1 shows a data carrier which is produced by the inventive method. An electronic module is glued in a two-step opening in card body 1, as made clear in FIG. 2.

Figure 2:
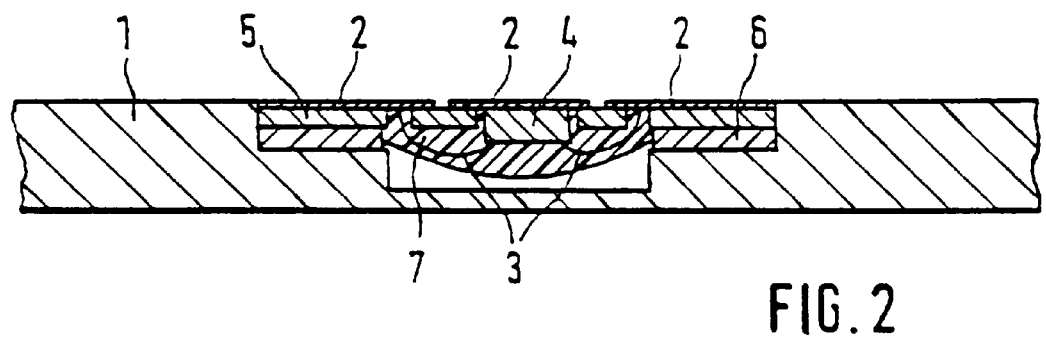
FIG. 2 shows a section of the data carrier of FIG. 1 along line II—II.

FIG. 2 shows a sectional view of a data carrier according to FIG. 1 along sectional line II—II. The electronic module includes carrier film 5 on one side of which contact surfaces 2 are located. Integrated circuit 4 is housed in a window of film 5 and connected with contact surfaces 2 through further windows in film 5 via bonding wires 3. Both integrated circuit 4 and bonding wires 3 are covered by casting compound 7. On the side of film 5 opposite contact surfaces 2 there is ring 6 of thermally activable adhesive which glues film 5 of the electronic module to the opening in card body 1. The gluing is done by heating thermally activable adhesive 6 and pressing the electronic module together with card body 1.

In a development of the data carrier not shown the electronic module can also he fixed by the card material. In this case ring 6 of thermally activable adhesive is dispensed with and film 5 has additional windows or openings for anchoring the electronic module. The module is mounted in the opening in the card body by being pressed into the opening under heat and pressure, whereby the card material softens and penetrates into the windows in film 5.

Figure 3:
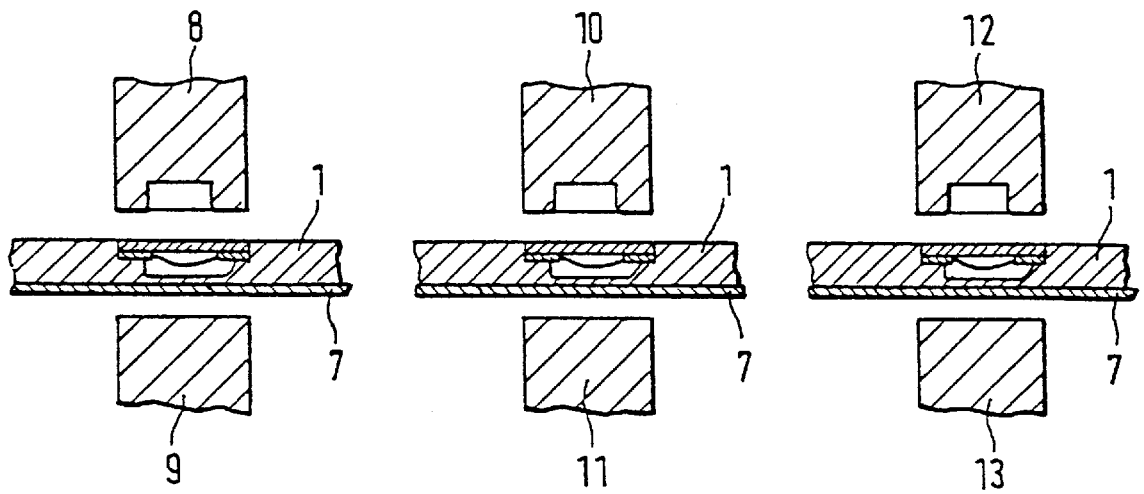
FIG. 3 shows single components of an inventive welding unit.
Figure 4:
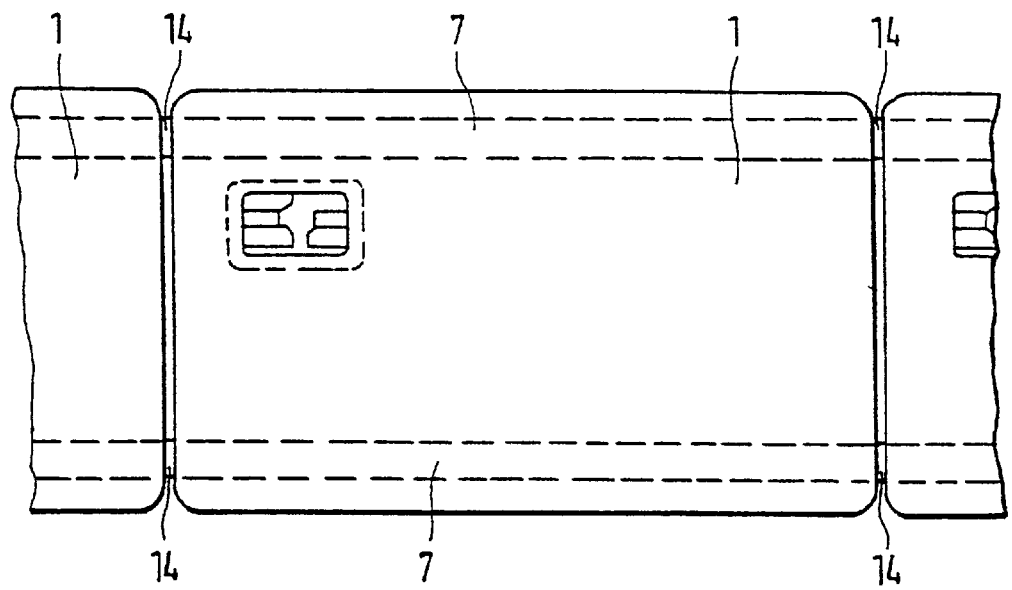
FIG. 4 shows a plan view of a data carrier located on transport bands.

An inventive welding unit for pressing the electronic module together with card body 1 under heat and pressure is shown in FIG. 3. The welding unit consists of tandem joined heatable dies 8 and 10 with corresponding cooling dies 9 and 11 as well as a further unit consisting of cooled dies 12 and 13. Die sets or elements 8, 9 and 10, 11 and 12, 13 may be referred to herein as die pairs. Furthermore the welding unit includes two transport bands 7 on which card bodies 1 with inserted electronic modules are disposed. Transport bands 7 are disposed in the vicinity of the long sides of card body 1 to permit engagement of said dies between the bands, as also shown in FIG. 4. For exact positioning of card body 1 in the individual processing units, transport bands 7 have carrying means 14 between which card body 1 is positioned exactly. Laterally the card bodies 1 are positioned by guide beads not shown here.

Gluing with the help of the welding unit takes place as follows. The transport bands position card body 1 between the die pair including heating die 8 and cooling die 9, where card body 1 is pressed together with the module under locally applied heat and thermally activable adhesive 6 of the module is thereby preheated. Then transport bands 7 transport card body 1 to the next device, where the electronic module with card body 1 is locally heated and pressed together by the die pair including heatable die 10 and cooling die 11 in such a way that thermally activable adhesive 6 melts, thereby gluing the electronic module to card body 1. After the gluing process card body 1 is transported by transport bands 7 to the cooling device, where the electronic module and card body 1 are pressed together and cooled between the cooling die pair including cooling dies 12 and 13. Transport bands 7 transport card body 1 in such a way that card body 1 is positioned in the following processing device once per cycle time.

In a development of the apparatus not shown, heating die 8 and cooling die 9 can be replaced by a heating device which partly surrounds the card body, the electronic module and optionally the thermally activable adhesive and thereby likewise preheats them in a first step.

In case the thermally activable adhesive or the electronic module is dispensed with and the substrate of the module instead has additional windows for fastening the module to the card body, the method as explained is performed in entirely analogous fashion. The apparatus is also constructed analogously in this case.

I claim:

1. A method for mounting an electronic module in an opening of a card body using heat and pressure comprising the steps of:

provising an electronic module including a carrier film and an integrated circuit;

providing a card body having a two step opening for receiving the module;

providing a thermally activatable adhesive between the module and the card body;

providing a first and second die heating device;

forming an assembly by inserting said electronic module and said adhesive in said opening of said card body;

then positioning the assembly in the first heating device and performing a first working step by locally preheating the assembly so as to preheat the adhesive;

then positioning the assembly in the second heating device and performing a second working step by pressing said card body and said module together under locally applied heat to thereby fix said module to said card body.

2. A method for mounting an electronic module in an opening of a card body using heat and pressure, comprising the steps of:

providing an electronic module including a carrier film and an integrated circuit;

providing a card body having a two step opening for receiving the module;

providing a first and second die heating device;

inserting said electronic module in said opening of said card body;

positioning the module and card body in the first heating device and performing a first working step by locally preheating the module and card body in an area of said opening;

then positioning the preheated card module in the second heating device and performing a second working step by pressing said card body and said module together under locally applied heat to thereby fix said module to said card body.

3. The method according to claim 1 or 2, including pressing the module and card body together along with said pre-heating during the first working step.

4. The method according to claim 1 or 2, including cooling the module and card body in a processing step following said second working step.

5. The method according to claim 1, including, after using said first and second heating devices to separately pre-heat and fix said card module to said card body, using a separate cooling die element to fully cool the module and card body in another successive step.

6. The method according to claim 1, including heating the adhesive during the second working step to a temperature higher than a temperature of preheating during the first working step.

7. The method according to claim 2, including heating the card body during the second working step to a temperature higher than a temperature of preheating during the first working step.

* * * * *